United States Patent
Kim et al.

(10) Patent No.: US 9,991,401 B2
(45) Date of Patent: Jun. 5, 2018

(54) SOLAR CELL AND METHOD FOR MANUFACTURING THE SAME

(71) Applicant: LG ELECTRONICS INC., Seoul (KR)

(72) Inventors: Kisu Kim, Seoul (KR); Giwon Lee, Seoul (KR); Ilhyoung Jung, Seoul (KR); Jeongbeom Nam, Seoul (KR)

(73) Assignee: LG ELECTRONICS INC., Seoul (KR)

(*) Notice: Subject to any disclaimer, the term of this patent is extended or adjusted under 35 U.S.C. 154(b) by 95 days.

(21) Appl. No.: 14/680,882

(22) Filed: Apr. 7, 2015

(65) Prior Publication Data
US 2015/0287849 A1 Oct. 8, 2015

(30) Foreign Application Priority Data
Apr. 8, 2014 (KR) .................. 10-2014-0041983

(51) Int. Cl.
| | | |
|---|---|---|
| *H01L 31/0224* | (2006.01) | |
| *H01L 31/05* | (2014.01) | |
| *H01L 31/0745* | (2012.01) | |
| *H01L 31/0747* | (2012.01) | |

(52) U.S. Cl.
CPC ........ *H01L 31/022425* (2013.01); *H01L 31/022441* (2013.01); *H01L 31/0516* (2013.01); *H01L 31/0745* (2013.01); *H01L 31/0747* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 8,334,161 B2 * | 12/2012 | Dennis .............. | H01L 31/02168 257/E27.124 |
| 2009/0162972 A1 | 6/2009 | Xu et al. | |
| 2009/0314341 A1 | 12/2009 | Borden et al. | |
| 2012/0037219 A1* | 2/2012 | Kim ................... | H01B 1/02 136/256 |
| 2012/0060912 A1 | 3/2012 | Cho et al. | |
| 2012/0211856 A1 | 8/2012 | Bettinelli et al. | |
| 2013/0104977 A1 | 5/2013 | Yasutake et al. | |
| 2013/0269771 A1 | 10/2013 | Cheun et al. | |
| 2013/0340804 A1 | 12/2013 | Moon et al. | |
| 2014/0060609 A1* | 3/2014 | Kumar .............. | H01L 31/0504 136/244 |
| 2014/0230878 A1 | 8/2014 | Schulte-Huxel et al. | |

FOREIGN PATENT DOCUMENTS

| | | |
|---|---|---|
| CN | 102714291 A | 10/2012 |
| DE | 10 2011 112 046 A1 | 3/2012 |
| EP | 2239788 A1 | 10/2010 |
| EP | 2439784 A1 | 4/2012 |

(Continued)

*Primary Examiner* — Robert Carpenter
(74) *Attorney, Agent, or Firm* — Birch, Stewart, Kolasch & Birch, LLP

(57) ABSTRACT

A solar cell is discussed. A solar cell includes a semiconductor substrate, a conductive type region on one surface of the semiconductor substrate, and an electrode connected to the conductive type region. The electrode includes an electrode layer on the conductive type region and a printed electrode layer on the electrode layer.

10 Claims, 9 Drawing Sheets

(56) References Cited

FOREIGN PATENT DOCUMENTS

| | | |
|---|---|---|
| EP | 2590233 A2 | 5/2013 |
| EP | 2677554 A1 | 12/2013 |
| EP | 2 711 988 A2 | 3/2014 |
| EP | 2811539 A1 | 12/2014 |
| JP | 2009-152589 A | 7/2009 |
| JP | 2010-41009 A | 2/2010 |
| JP | 2011-517120 A | 5/2011 |
| JP | 2012-60123 A | 3/2012 |
| JP | 2013-510435 A | 3/2013 |
| JP | 2013-239476 A | 11/2013 |
| KR | 10-2003-0055740 A | 7/2003 |
| KR | 10-2010-0132323 A | 12/2010 |
| KR | 10-2012-0035291 A | 4/2012 |
| KR | 10-2012-0113548 A | 10/2012 |
| WO | WO 2012/171968 A1 | 12/2012 |
| WO | WO 2013/054396 A1 | 4/2013 |

* cited by examiner

SOLAR CELL AND METHOD FOR MANUFACTURING THE SAME

CROSS-REFERENCE TO RELATED APPLICATION

This application claims the priority benefit of Korean Patent Application No. 10-2014-0041983, filed on Apr. 8, 2014 in the Korean Intellectual Property Office, the disclosure of which is incorporated herein by reference.

BACKGROUND OF THE INVENTION

1. Field of the Invention

Embodiments of the invention relate to a solar cell and a method for manufacturing the same, and, more particularly, to a solar cell having an improved structure and a method for manufacturing the same.

2. Description of the Related Art

In recent years, as conventional energy resources such as petroleum and coal are running out, interest in alternative energy resources replacing these energy resources is on the rise. Of these, solar cells are attracting considerable attention as next generation cells which convert solar energy into electrical energy.

Such a solar cell is manufactured by forming various layers and electrodes according to design. Efficiency of solar cells may be determined according to the design of various layers and electrodes. Low efficiency should be overcome so that solar cells can be put to practical use. Accordingly, various layers and electrodes should be designed such that solar cell efficiency is maximized.

SUMMARY OF THE INVENTION

The embodiments of the invention relate to providing a solar cell being able to enhance efficiency and a method for manufacturing the solar cell being able to simplify a manufacturing process.

A solar cell according to one embodiment of the invention includes a semiconductor substrate, a conductive type region on one surface of the semiconductor substrate, and an electrode connected to the conductive type region. The electrode includes an electrode layer on the conductive type region and a printed electrode layer on the electrode layer.

A method for manufacturing a solar cell according to one embodiment of the invention includes forming a conductive type region on one surface of a semiconductor substrate and forming an electrode on the conductive type region. The forming of the electrode includes forming a metal layer on an entire area of the conductive type region, forming a printed electrode layer having a pattern on the electrode layer, and forming an electrode layer between the conductive type region and the printed electrode layer. The forming of the electrode layer includes patterning the metal layer by using the printed electrode layer as a mask.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
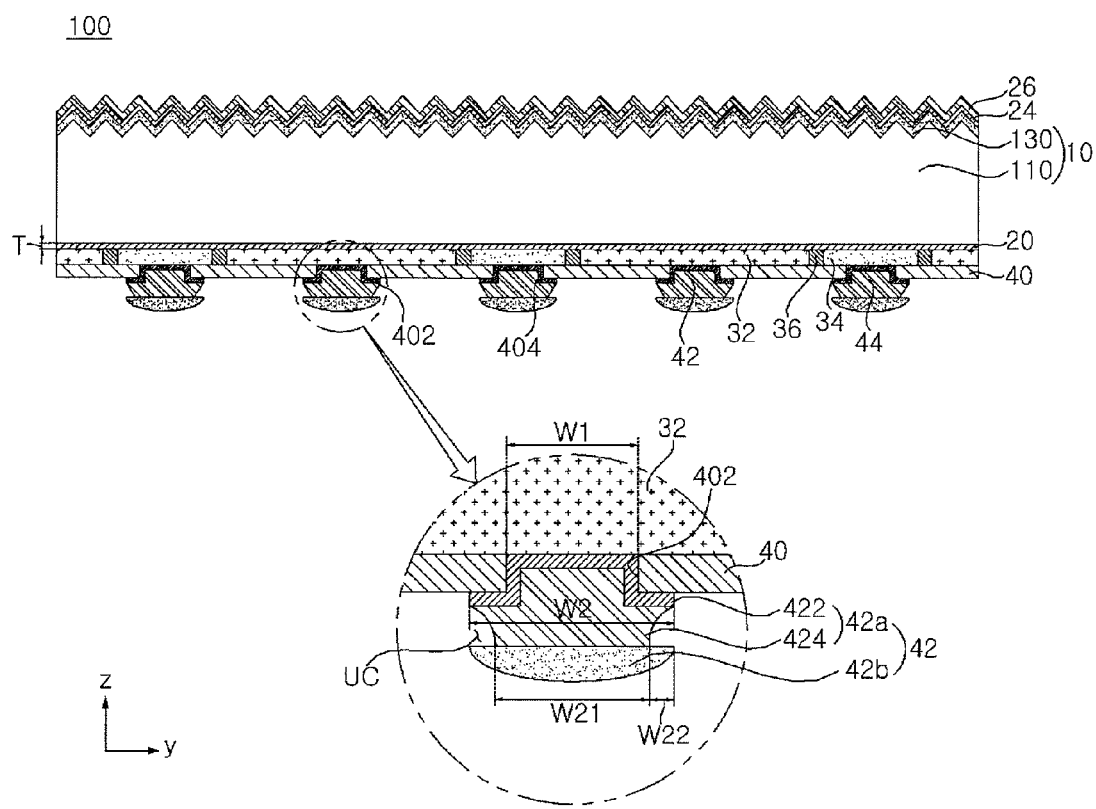
FIG. 1 is a sectional view of a solar cell according to an embodiment of the invention.

Reference will now be made in detail to embodiments of the invention, examples of which are illustrated in the accompanying drawings. However, the invention may be embodied in many different forms and should not be construed as limited to the embodiments of the invention set forth herein.

Only elements constituting features of the invention are illustrated in the accompanying drawings and other elements that are not features of the invention will not be described herein and are omitted from the drawings, for clarity of description. Like reference numerals refer to like elements throughout. In the drawings, the thicknesses, areas, etc., of constituent elements may be exaggerated or reduced for clarity and convenience of illustration. The embodiments of the invention are not limited to the illustrated thicknesses, areas, etc.

It will be further understood that, throughout this specification, when one element is referred to as "comprising" or "including" another element, the term "comprising" or "including" specifies the presence of another element but does not preclude the presence of other additional elements, unless context clearly indicates otherwise. In addition, it will be understood that when one element such as a layer, a region or a plate is referred to as being "on" another element, the one element may be directly on the another element, and one or more intervening elements may also be present. In contrast, when one element such as a layer, a region or a plate is referred to as being "directly on" another element, one or more intervening elements are not present.

Hereinafter, a solar cell according to an embodiment of the invention and an electrode used for the same will be described in detail with reference to the accompanying drawings.

Figure 2:
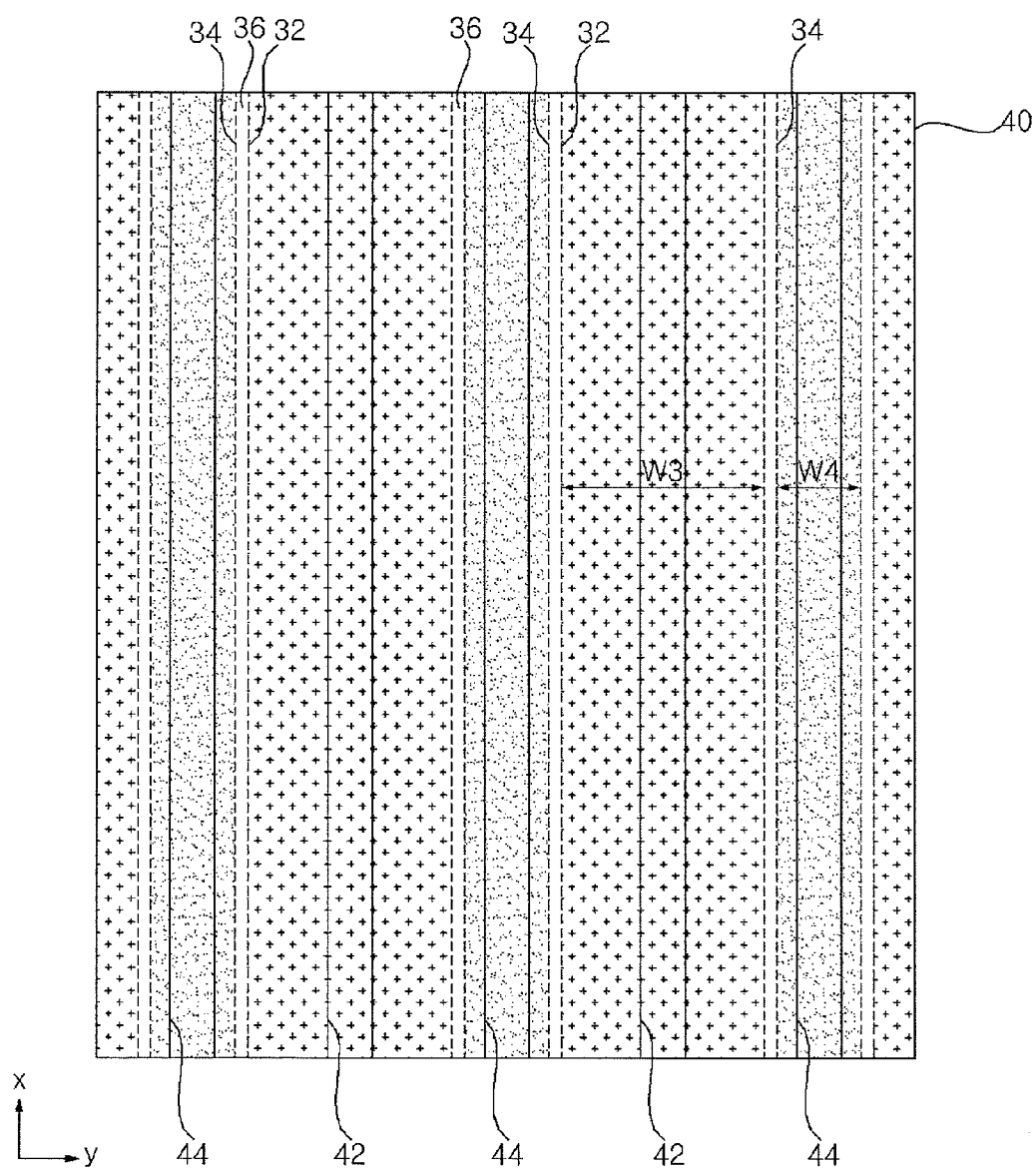
FIG. 2 is a partial rear plan view of the solar cell illustrated in FIG. 1.

FIG. 1 is a sectional view of a solar cell according to an embodiment of the invention, and FIG. 2 is a partial rear plan view of the solar cell illustrated in FIG. 1.

Referring to FIGS. 1 and 2, a solar cell 100 according to an embodiment of the invention includes a semiconductor substrate 10, a conductive type region 32 or 34 (or conductive type regions 32 and 34) on one surface (for example, a back surface) of the semiconductor substrate 10, and an electrode 42 or 44 (or electrodes 42 and 44) connected to the conductive type region 32 or 34. The electrode 42 or 44 includes an electrode layer 42a on the conductive type region 32 or 34 and a printed electrode layer 42b on the electrode layer 42a. The solar cell 100 may further include a tunneling layer 20, a passivation layer 24, an anti-reflective layer 26, an insulating layer 40, and the like. This will be described in more detail.

The semiconductor substrate 10 may include a base region 110 including a second conductive type dopant (of dopants) at a relatively low doping concentration. The base region 110 may include crystalline (single-crystalline or polycrystalline) silicon including the second conductive type dopant.

For example, the base region 110 may be a single-crystalline silicon substrate including the second conductive type dopant. The second conductive type dopant may be of an n-type or a p-type. When the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like. For example, when the base region 110 is of an n-type, the first conductive type region 32 of a p-type to form a junction (e.g., a pn junction with the tunneling layer 20 disposed therebetween) with the base region 110 that forms carriers by photoelectric conversion has a wide area and thus a photoelectric conversion area may be increased. In addition, in this instance, the first conductive type region 32 having a wide area effectively collects holes having a relatively slow movement rate and thus may further contribute to improvement in photoelectric conversion efficiency. However, the embodiment of the invention is not limited to the above examples.

In addition, the semiconductor substrate 10 may include a front surface field region 130 at a front surface thereof. The front surface field region 130 may have the same conductive type as that of the base region 110 and a higher doping concentration than the base region 110.

In the embodiment of the invention, the front surface field region 130 is a doping region formed by doping the semiconductor substrate 10 with the second conductive type dopant at a relatively high doping concentration. Accordingly, the front surface field region 130 constitutes a part of the semiconductor substrate 10, including a crystalline (single-crystalline or polycrystalline) semiconductor of the second conductive type. For example, the front surface field region 130 may be formed as a part of a single-crystalline semiconductor substrate (e.g., a single-crystalline silicon wafer substrate) of the second conductive type. However, the embodiment of the invention is not limited to the above examples. Thus, the front surface field region 130 may be formed by doping a separate semiconductor layer (e.g., an amorphous semiconductor layer, a micro-crystalline semiconductor layer, or a polycrystalline semiconductor layer) from the semiconductor substrate 10 with a second conductive type dopant. In another embodiment of the invention, the front surface field region 130 may be a field region that acts similarly to a region formed through doping by fixed charges of a layer (e.g., the passivation layer 24 and/or the anti-reflective layer 26) formed adjacent to the semiconductor substrate 10. The front surface field region 130 having various structures may be formed using various other methods.

In the embodiment of the invention, the front surface of the semiconductor substrate 10 may be textured to have an uneven surface (or protruded portions and/or depressed portions) in the form of a pyramid, or the like. Through the texturing process, the uneven portion is formed at the front surface of the semiconductor substrate 10 and thus surface roughness thereof increases, whereby reflectance of light incident upon the front surface of the semiconductor substrate 10 may be reduced. Accordingly, the amount of light reaching a pn junction formed by the base region 110 and the first conductive type region 32 may be increased and, consequently, light loss may be minimized.

Meanwhile, the back surface of the semiconductor substrate 10 may be a relatively smooth and even surface formed by mirror polishing or the like and having a lower surface roughness than the front surface of the semiconductor substrate 10. As in the embodiment of the invention, when the first and second conductive type regions 32 and 34 are formed together on the back surface of the semiconductor substrate 10, characteristics of the solar cell 100 may largely vary according to characteristics of the back surface of the semiconductor substrate 10. Since an uneven portion by texturing is not formed at the back surface of the semiconductor substrate 10, passivation characteristics may be enhanced and, accordingly, the characteristics of the solar cell 100 may be enhanced. However, the embodiment of the invention is not limited to the above example. In some instances, an uneven portion may be formed at the back surface of the semiconductor substrate 10 by texturing. In addition, various modifications are possible.

The tunneling layer 20 may be formed on the back surface of the semiconductor substrate 10. The tunneling layer 20 acts as a kind of a barrier to electron and hole. Thus, minority carrier cannot pass through the tunneling layer 20. Meanwhile, majority carrier is accumulated at a portion adjacent to the tunneling layer 20, and then, the majority carrier having the predetermined energy passes through the tunneling layer 20. In this instance, the majority carrier having the predetermined energy can easily and smoothly pass through the tunneling layer 20 by a tunneling effect. Also, the tunneling layer 20 also acts as a diffusion barrier for preventing the dopant of the conductive type regions 32 and 34 from diffusing into the semiconductor substrate 10. The tunneling layer 20 may include various materials enabling majority carriers to tunnel therethrough, e.g., an oxide, a nitride, a semiconductor, a conductive polymer, or the like. For example, the tunneling layer 20 may include a silicon oxide, a silicon nitride, a silicon oxynitride, an intrinsic amorphous silicon, an intrinsic polycrystalline silicon, or the like. In this regard, the tunneling layer 20 may be formed over the entire back surface of the semiconductor substrate 10. Accordingly, the tunneling layer 20 can be easily formed without separate patterning.

To have sufficient tunneling effects, the tunneling layer 20 may have a thickness T that is smaller than that of the insulating layer 40. For example, the thickness T of the tunneling layer 20 may be 10 nm or less, for example, 0.5 nm to 10 nm (more particularly, 0.5 nm to 5 nm, e.g., 1 nm to 4 nm). When the thickness T of the tunneling layer 20 exceeds 10 nm, tunneling does not smoothly occur and thus the solar cell 100 may not operate. On the other hand, when the thickness T of the tunneling layer 20 is less than 0.5 nm, it may be difficult to form the tunneling layer 20 with desired quality. To further improve the tunneling effects, the thickness T of the tunneling layer 20 may be 0.5 nm to 5 nm (more particularly, 1 nm to 4 nm). However, the embodiment of the invention is not limited to the above examples and the thickness T of the tunneling layer 20 may have various values.

The conductive type regions 32 and 34 may be disposed on the tunneling layer 20. More particularly, the conductive type regions 32 and 34 may include the first conductive type region 32 including the first conductive type dopant thus having the first conductive type and the second conductive type region 34 including the second conductive type dopant thus having the second conductive type. In addition, a barrier region 36 may be disposed between the first and second conductive type regions 32 and 34.

The first conductive type region 32 forms a pn junction (or pn tunnel junction) with the base region 110 while disposing the tunneling layer 20 therebetween and thus constitutes an emitter region that generates carriers by photoelectric conversion.

In this regard, the first conductive type region 32 may include a semiconductor (e.g., silicon) including the first conductive type dopant opposite the base region 110. In the embodiment of the invention, the first conductive type region 32 is formed separately from the semiconductor substrate 10, on the semiconductor substrate 10 (more particularly, on the tunneling layer 20). The first conductive type region 32 may be formed as a semiconductor layer doped with the first conductive type dopant. Thus, the first conductive type region 32 may be formed as a semiconductor layer having a different crystal structure from the semiconductor substrate 10 so as to be easily formed on the semiconductor substrate 10. For example, the first conductive type region 32 may be formed by doping an amorphous semiconductor, a micro-crystalline semiconductor or a poly-crystalline semiconductor (e.g., amorphous silicon, micro-crystalline silicon, or polycrystalline silicon) that may be easily manufactured by various methods such as deposition and the like, with the first conductive type dopant. The first conductive type dopant may be included in the semiconductor layer when forming the semiconductor layer or may be included in the semiconductor layer by various doping methods such as thermal diffusion, ion implantation, and the like after forming the semiconductor layer.

In this regard, the first conductive type dopant may be any dopant having a conductive type opposite the base region 110. That is, when the first conductive type dopant is of a p-type, the first conductive type dopant may be a Group III element such as B, Al, Ga, In, or the like. When the first conductive type dopant is of an n-type, the first conductive type dopant may be a Group V element such as P, As, Bi, Sb, or the like.

The second conductive type region 34 forms a back surface field region that forms a back surface field and thus prevents loss of carriers by recombination at a surface (more particularly, the back surface) of the semiconductor substrate 10.

In this regard, the second conductive type region 34 may include a semiconductor (e.g., silicon) including the same second conductive type dopant as that of the base region 110. In the embodiment of the invention, the second conductive type region 34 is formed separately from the semiconductor substrate 10, on the semiconductor substrate 10 (more particularly, on the tunneling layer 20). The second conductive type region 34 is formed as a semiconductor layer doped with a second conductive type dopant. Thus, the second conductive type region 34 may be formed as a semiconductor layer having a different crystal structure from the semiconductor substrate 10 so as to be easily formed on the semiconductor substrate 10. For example, the second conductive type region 34 may be formed by doping an amorphous semiconductor, a micro-crystalline semiconductor or a polycrystalline semiconductor (e.g., amorphous silicon, micro-crystalline silicon, or polycrystalline silicon) that may be easily manufactured by various methods such as deposition and the like, with the second conductive type dopant. The second conductive type dopant may be included in the semiconductor layer when forming the semiconductor layer or may be included in the semiconductor layer by various doping methods such as thermal diffusion, ion implantation, and the like after forming the semiconductor layer.

In this regard, the second conductive type dopant may be any dopant having the same conductive type as that of the base region 110. That is, when the second conductive type dopant is of an n-type, the second conductive type dopant may be a Group V element such as P, As, Bi, Sb, or the like. When the second conductive type dopant is of a p-type, the second conductive type dopant may be a Group III element such as B, Al, Ga, In, or the like.

In addition, the barrier region 36 is disposed between the first and second conductive type regions 32 and 34 to separate the first conductive type region 32 from the second conductive type region 34. When the first and second conductive type regions 32 and contact each other, shunting may occur and, accordingly, performance of the solar cell 100 may be deteriorated. Thus, in the embodiment of the invention, the barrier region 36 may be disposed between the first and second conductive type regions 32 and 34 to prevent unnecessary occurrence of shunting.

The barrier region 36 may include various materials enabling the first and second conductive type regions 32 and 34 to be substantially insulated from each other. That is, the barrier region 36 may be formed of an undoped insulating material (e.g., an oxide or a nitride). In another embodiment of the invention, the barrier region 36 may include an intrinsic semiconductor. In this regard, the first and second conductive type regions 32 and 34 and the barrier region 36 are formed on the same plane, have substantially the same thickness, are formed of the same semiconductor (e.g., amorphous silicon, micro-crystalline silicon, or polycrystalline silicon), and the barrier region 36 may not include a dopant. For example, a semiconductor layer including a semiconductor material may be formed, a region of the semiconductor layer is doped with a first conductive type dopant to form the first conductive type region 32, another region thereof is doped with a second conductive type dopant to form the second conductive type region 34, and the barrier region 36 may be formed in a region of the semiconductor layer in which the first and second conductive type regions 32 and 34 are not formed. According to the embodiment of the invention, a manufacturing method of the first and second conductive type regions 32 and 34 and the barrier region 36 may be simplified.

However, the embodiment of the invention is not limited to the above examples. That is, when the barrier region 36 is formed separately from the first and second conductive type regions 32 and 34, the barrier region 36 may have a different thickness than that of the first and second conductive type regions 32 and 34. For example, to more effectively prevent a short circuit between the first and second conductive type regions 32 and 34, the thickness of the barrier region 36 may be greater than that of the first and second conductive type regions 32 and 34. In another embodiment of the invention, to reduce raw material costs for forming the barrier region 36, the thickness of the barrier region 36 may be less than that of the first and second conductive type regions 32 and 34. In addition, various modifications are possible. In addition, a base material of the barrier region 36 may be different than those of the first and second conductive type regions 32 and 34. In another embodiment of the invention, the barrier region 36 may be formed as an empty space (e.g., a trench) disposed between the first and second conductive type regions 32 and 34.

In addition, the barrier region 36 may be formed so as to partially separate the first and second conductive type regions 32 and 34 at an interface therebetween from each other. Thus, some portions of the interface between the first and second conductive type regions 32 and 34 may be separated from each other, while the other portion of the interface between the first and second conductive type regions 32 and 34 may contact each other. In addition, the barrier region 36 may not be necessarily formed, and the first and second conductive type regions 32 and 34 may entirely contact each other. In addition, various modifications are possible.

In this regard, the second conductive type region 34 having the same conductive type as that of the base region 110 may have a narrower area than that of the first conductive type region 32 having a different conductive type than that of the base region 110. Thus, a pn junction formed between the base region 110 and the first conductive type region 32 via the tunneling layer 20 may have a wider area. In this regard, when the base region 110 and the second conductive type region 34 are of the n-types and the first conductive type region 32 is of the p-type, the first conductive type region 32 having a wide area may effectively collect holes having a relatively slow movement rate. The planar structure of the first and second conductive type regions 32 and 34 and the barrier region 36 will be described below in further detail with reference to FIG. 2.

In the embodiment of the invention, an instance in which the first and second conductive type regions 32 and 34 are disposed on the back surface of the semiconductor substrate 10 while interposing the tunneling layer 20 between the first and second conductive type regions 32 and 34 and the semiconductor substrate 10 has been described by way of example. However, the embodiment of the invention is not limited to the above example. In another embodiment of the invention, the tunneling layer 20 need not be formed and the first and second conductive type regions 32 and 34 may be formed as doping regions formed by doping the semiconductor substrate 10 with a dopant. That is, the first and second conductive type regions 32 and 34 may be formed as doping regions having a single-crystalline semiconductor structure constituting parts of the semiconductor substrate 10. The conductive type regions 32 and 34 may be formed by the other various methods. In addition, the first conductive type region 32 may be formed on one surface of the semiconductor substrate 10 and the second conductive type region 34 may be formed on the other surface of the semiconductor substrate 10. In this instance, the descriptions regarding the conductive type regions 32 and 34 and the electrodes 42 and 44 may be applied to the first conductive type region 32 and the first electrode 42 connected to the first conductive type region 32, and/or to the second conductive type region 34 and the second electrode 44 connected to the second conductive type region 34.

An insulating layer 40 may be formed on the first and second conductive type regions 32 and 34 and the barrier region 36. The insulating layer 40 may prevent electrodes to which the first and second conductive type regions 32 and 34 must not be connected (i.e., the second electrode 44 for the first conductive type region 32 and the first electrode 42 for the second conductive type region 34) from being connected to each other and may passivate the first and second conductive type regions 32 and 34. The insulating layer 40 includes first openings 402 for exposing the first conductive type region 32 and second openings 404 for exposing the second conductive type region 34.

The insulating layer 40 may have a thickness the same as or larger than the tunneling layer 20. Then, the insulating property and the passivation property of the insulating layer 40 can be enhanced. For example, the insulating layer 40 may include various insulating materials (for example, an oxide, a nitride, and so on). For example, the insulating layer 40 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiment is not limited thereto, and thus, the insulating layer 40 may include one or more of various materials.

The electrodes 42 and 44 disposed on the back surface of the semiconductor substrate 10 include the first electrode 42 electrically and physically connected to the first conductive type region 32 and the second electrode 44 electrically and physically connected to the second conductive type region 34.

In the embodiment of the invention, the first electrode 42 is connected to the first conductive type region 32 through penetrating of the first opening 402 of the insulating layer 40. The second electrode 44 is connected to the second conductive type region 34 through penetrating of the second opening 404 of the insulating layer 40. The first and second electrodes 42 and 44 may include various metal materials. In addition, the first and second electrodes 42 and 44 are not electrically connected to each other but are respectively connected to the first conductive type region 32 and the second conductive type region 34, and may have various planar shapes enabling collection of carriers generated and transfer of the collected carriers to the outside. However, the shapes of the first and second electrodes 42 and 44 are not limited to the above example.

Hereinafter, a stacked structure of the first electrode 42 and/or the second electrode 44 will be described in detail with reference to an enlarged circle of FIG. 1, and then, a planar shape of the first electrode 42 and/or the second electrode 44 will be described in detail with reference to FIG. 2. The first electrode 42 will be described below with reference to the enlarged circle of FIG. 1 and the detailed descriptions by way of example, but the following descriptions may also be applied to the second electrode 44. That is, the descriptions of the stacked structure of the first electrode 42 may be applied to those of the second electrode 44.

Referring to the enlarged circle of FIG. 1, the first electrode 42 includes the electrode layer 42a on the conductive type region 32 or 34 (particularly, the first conducive type region 32 for the first electrode 42 or the second conducive type region 34 for the second electrode 44), and the printed electrode layer 42b on the electrode layer 42a. In this instance, the electrode layer 42a has an enhanced contact property with the first conductive type region 32 (or with the second conducive type region 34 for the second electrode 44) and has a relatively low electrical resistance. Thus, the carrier can be effectively collected by the electrode layer 42a. The printed electrode layer 42b increases a thickness of the first electrode 42 and reduces the electrical resistance of the first electrode 42. Also, the printed electrode layer 42b is used for a mask during the patterning of the electrode layer 42a. This will be described in more detail.

The electrode layer 42a disposed between the conductive type region 32 or 34 and the printed electrode layer 42b may include a plurality of sub-layers to satisfy various properties of the first electrode 42. For example, the electrode layer 42a may include the first layer 422 and the second layer 424 formed on the first layer 422. The first layer 422 contacts the semiconductor layer for the first conductive type region 32 (the second conductive type region 34 in the instance of the second electrode 44) and may be transparent and conductive. The second layer 424 has a thickness larger than the first layer 422, and thus, the electrical resistance of the first electrode 42 can be effectively reduced. The first layer 422 may enhance contact property and adhesion property of the first conductive type region 32 and the second layer 424.

The first layer 422 may be formed between the semiconductor layer and the second layer 424 in contact therewith. The first layer 422 has conductivity and may include a metal having excellent contact characteristics with the semiconductor layer. Accordingly, conductivity of the first electrode 42 need not be reduced and adhesion between the semiconductor layer and the second layer 424 may be enhanced. To enhance contact characteristics with the semiconductor layer, the first layer 422 may have a coefficient of thermal expansion between a coefficient of thermal expansion of the semiconductor layer and a coefficient of thermal expansion of a portion of the second layer 424 adjacent to the first layer 422.

More particularly, when a difference between the coefficients of thermal expansion of the semiconductor layer and the first electrode 42 is large, interfacial contact between the semiconductor layer and the first electrode 42 may be deteriorated when various heat treatment processes for forming the solar cell 100 are performed. Accordingly, a contact resistance between the semiconductor layer and the first electrode 42 may be increased. This may be more problematic when a line width of the semiconductor layer or the first electrode 42 is small and a contact area between the semiconductor layer and the first electrode 42 is small. Thus, in the embodiment of the invention, a coefficient of thermal expansion difference between the semiconductor layer and the first electrode 42 is reduced by restricting a coefficient of thermal expansion of the first layer 422 of the first electrode 42 adjacent to semiconductor layer, which results in enhanced interfacial contact characteristics.

The semiconductor layer has a coefficient of thermal expansion of about 4.2 ppm/K when including silicon, and copper (Cu), aluminum (Al), silver (Ag), gold (Au), or the like that may constitute the portion of the second layer 424 adjacent to the first layer 422 (e.g., in the embodiment of the invention, the second layer 424) has a coefficient of thermal expansion of approximately 14.2 ppm/K or more. More particularly, Cu has a coefficient of thermal expansion of about 16.5 ppm/K, Al has a coefficient of thermal expansion of about 23.0 ppm/K, Ag has a coefficient of thermal expansion of about 19.2 ppm/K, and Au has a coefficient of thermal expansion of about 14.2 ppm/K.

Considering this, a material (e.g., a metal) constituting the first layer 422 may have a coefficient of thermal expansion of about 4.5 ppm/K to about 14 ppm/K. When the coefficient of thermal expansion of the material is less than 4.5 ppm/K or exceeds 14 ppm/K, a difference between the coefficients of thermal expansion of the first layer 422 and the semiconductor layer may not be reduced and thus adhesion enhancement effects may be insufficient. Considering this, the first layer 422 may include titanium (Ti) having a coefficient of thermal expansion of about 8.4 ppm/K or tungsten (W) having a coefficient of thermal expansion of about 4.6 ppm/K. For example, the first layer 422 may be formed of Ti or W.

As such, when the first layer 422 includes Ti or W, contact characteristics may be enhanced by reducing a difference between the coefficients of thermal expansion of the first layer 422 and the semiconductor layer. In addition, Ti or W may act as a barrier of a material (e.g., Cu or the like) constituting the portion (e.g., in the embodiment of the invention, the second layer 424) of the second layer 424 adjacent to the first layer 422 and thus may prevent the material from diffusing into the semiconductor layer or the semiconductor substrate 10. Accordingly, problems that may occur through diffusion of the material constituting the second layer 424 into the first and second conductive type regions 32 and 34 or the semiconductor substrate 10 may be prevented or reduced.

However, the embodiment of the invention is not limited thereto. Thus, the first layer 422 may include nickel, tantalum, cobalt, aluminum, molybdenum, chrome, and so on.

In this regard, the first layer 422 according to the embodiment of the invention may have transparency, which allows light to pass therethrough. When the first layer 422 has a small thickness even when including a metal, the first layer 422 may have transparency. Thus, in the embodiment of the invention, the first layer 422 may have light transmitting properties by restricting the thickness of the first layer 422 to a certain level or less. When the first layer 422 has transparency, light having passed through the first layer 422 is directed back into the semiconductor substrate 10 by reflection from the second layer 424 formed on the first layer 422 or a layer constituting a portion of the second layer 424 (e.g., the second layer 424). Due to reflection of light from the first electrode 42, the amount and residence time of light present in the semiconductor substrate 10 is increased and, accordingly, efficiency of the solar cell 100 may be enhanced.

The term "transparency" as used herein includes an instance in which light is completely (i.e., 100%) transmitted and an instance in which light is partially transmitted. That is, the first layer 422 may be a metal transparent film or a metal semi-transparent film. For example, the first layer 422 may have a transparency of 50% to 100%, more particularly 80% to 100%. When the transparency of the first layer 422 is less than 50%, the amount of light reflected from the second layer 424 is insufficient and thus it may be difficult to sufficiently enhance the efficiency of the solar cell 100. When the transparency of the first layer 422 is 80% or more, the amount of light reflected from the second layer 424 may be further increased and thus may further contribute to improvement in the efficiency of the solar cell 100.

For this operation, the first layer 422 may have a smaller thickness than the second layer 424. In the embodiment of the invention, the second layer 424 is formed of one single layer; however, the embodiment is not limited thereto. Thus, the second layer 424 may include a plurality of layers. In this instance, the first layer 422 may have a smaller thickness than each of the layers of the second layer 424. Thus, the first layer 422 may be formed so as to have transparency.

In particular, the first layer 422 may have a thickness of 50 nm or less. When the thickness of the first layer 422 exceeds 50 nm, the transparency of the first layer 422 is reduced and thus the amount of light directed to the second layer 424 may be insufficient. The transparency of the first layer 422 may be further enhanced by forming the first layer 422 to a thickness of 15 nm or less. In this regard, the thickness of the first layer 422 may be between 2 nm and 50 nm (e.g., between 2 nm and 15 nm). When the thickness of the first layer 422 is less than 2 nm, it may be difficult to uniformly form the first layer 422 and adhesion enhancement effects obtained by the first layer 422 may be insufficient. However, the embodiment of the invention is not limited to the above examples and the thickness and the like of the first layer 422 may vary in consideration of materials, manufacturing conditions, and the like.

The second layer 424 formed on the first layer 422 may be a single layer or may include a plurality of layers so as to enhance various characteristics and the like. In the embodiment of the invention, the second layer 424 may be a single layer between the first layer 422 and the printed electrode layer 42b and being in contact with the first layer 422 and the printed electrode layer 42b. The second layer 424 reduces resistance of the first electrode 42 and increases electrical conductivity, and acts as an electrically conductive layer where the current is substantially transferred. Also, the second layer 424 acts as a barrier that prevents a material constituting the printed electrode layer 42b from migrating to the semiconductor layer or the semiconductor substrate 10 and reflects light by a reflective material. That is, the second layer 424a may act as a conductive layer, a barrier layer, and a reflective electrode layer. The second layer 424 may be formed of a metal having excellent reflection properties and may include, for example, Cu, Al, Ag, Au, or an alloy thereof.

The second layer 424 has a greater thickness than the first layer 422 and may have a thickness of 50 nm to 400 nm. For example, the second layer 424 may have a thickness of 50 nm to 300 nm. When the thickness of the second layer 424 is less than 50 nm, it may be difficult for the second layer 424a to act as a barrier layer and a reflective metal layer. When the thickness of the second layer 424 exceeds 400 nm, reflection properties and the like are not significantly enhanced and manufacturing costs may be increased. When the thickness of the second layer 424 is 300 nm or less, effect for reducing the resistance of the second layer 424 can be sufficient and a peeling due to an increase of thermal stress can be effectively prevented. However, the embodiment of the invention is not limited thereto, and thus, the thickness of the second layer 424 may be varied.

In the embodiment of the invention, it is exemplified that the electrode layer 42a includes the first layer 422 and the second layer 424. However, the embodiment of the invention is not limited thereto. Thus, the electrode layer 42a may be formed of a single layer, or the electrode layer 42 may include an additional layer besides the first layer 422 and the second layer 424. Particularly, a third layer (not shown) may be further positioned on the second layer 424 (that is, between the second layer 424 and the printed electrode layer 42b). For example, the third layer may include Sn or a Nickel-Vanadium (Ni—V) alloy. The third layer has a high melting point higher than a melting point of the first layer 422 and the second layer 424. And thus, the third layer may sufficiently act as a capping film to protect the electrode layer 42a during a high-temperature process that will be performed later. However, the embodiment of the invention is limited thereto. The materials of the third layer may be varied and the position of the third layer may be varied, and an additional layer besides the third layer may be further formed.

In the embodiment of the invention, the electrode layer 42a including the first layer 422 and the second layer 424 is a plated layer formed by a plating or a sputtered layer formed by a sputtering. The electrode layer 42a formed by the plating or the sputtering does not include polymer materials such as the solvent, the resin, and so on, inorganic materials such as glass frit and so on. The electrode layer 42a is formed of pure metals (for example, purity (wt % or vol %) of 99% or more (for example, purity of 99.9%)), except for unavoidable impurities. That is, the electrode layer 42a is formed by the plating or the sputtering, and thus, the metal content of the electrode 42a is high. Also, a plurality of grains or the like are included in each the first layer 422 and the second layer 424 constituting the electrode layer 42a. By the above characteristic, it can be seen that the electrode layer 42a is formed by the plating or the sputtering.

That is, metal layers (constituting the first layer 422 and the second layer 424, respectively) are entirely formed by the plating and/or the sputtering to fill the opening (or openings) 402 (the opening (or openings) 404 in the instance of the second electrode 44) of the insulating layer 40 formed on the back surface of the semiconductor substrate 10. Then, the patterning of the metal layers are performed to form the first electrode 42 (and/or the second electrode 44) having the first layer 422 and the second layer 424. The patterning of the metal layers may be performed by using the printed electrode layer 42b as a mask in the patterning process, thereby forming the electrode layer 42a. This will be described in more detail with reference FIGS. 3a to 3j.

When the electrode layer 42 may be formed by the plating or the sputtering, materials of the metal layers are stacked in a thickness direction of the solar cell 100. Therefore, the first layer 422 has a uniform thickness at an entire portion, and the second layer 424 has a uniform thickness at an entire portion. Here, the uniform thickness means a thickness that can be regarded as the same thickness considering (or within) the margin of error, for example, a thickness having a difference less than 10%.

Referring to FIG. 1 again, the first electrode 42 may have a width W2 larger than a width W1 of the opening 402. Then, the first electrode 42 (a width of a broadest portion of the first electrode 42) has a large width, and the electrical resistance of the first electrode 42 can be reduced. For example, the opening 402 has the width W1 of about 10 μm to about 50 μm, and the first electrode 42 has the width W2 of about 100 μm to about 500 μm. When the opening 402 has the width W1 less than 10 μm, the connection property of the first electrode 42 and the first conductive type region 32 may be deteriorated. When the opening 402 has the width W1 larger than about 50 μm, the first conductive type region 32 may be damaged during forming the opening 402. When the first electrode 42 has the width W2 is less than about 100 μm, the first electrode 42 may not have the sufficient resistance. When the first electrode 42 has the width W2 larger than about 500 μm, the first electrode 42 may be unwantedly short-circuited to the adjacent second electrode 44. However, the embodiment of the invention is not limited thereto, and thus, the width W1 of the opening 402 and the width W2 of the first electrode 42 may have various values.

Therefore, the electrode layer 42a (particularly, the first layer 422) may be formed on a bottom surface of the opening 402 (that is, a contact surface with the semiconductor layer or the conductive type regions 32 and 34), on a side surface (or side surfaces) of the insulating layer 40 adjacent to the opening 402, and on an upper surface (back surface in the drawing) of the insulating layer 40 adjacent to the opening 402. Particularly, the first layer 422 may be in contact with the bottom surface of the opening 402 (that is, the contact surface with the semiconductor layer or the conductive type regions 32 and 34), with the side surfaces of the insulating layer 40 adjacent to the opening 402, and with the upper surface of the insulating layer 40 adjacent to the opening 402. Since the first layer 422 is formed on the side surfaces of the insulating layer 40 adjacent to the opening 402 and on the upper surface of the insulating layer 40 as in the above, it can be seen that the electrode layer 42a is formed by forming the metal layers for forming the electrode layer 42a over the entire portion of the insulating layer 40 and patterning the metal layers.

Also, in the embodiment of the invention, at least a part of the side surfaces of the electrode layer 42a (particularly, the side surfaces of a portion of the electrode layer 42a that is formed on the insulating layer 40) may have an etched trace. The etched trace may be one of various traces formed by the etching when the patterning of the electrode layer 42a is performed. For example, at least a part of the side surfaces of the electrode layer 42a may have an undercut UC when the patterning of the electrode layer 42a is performed by using a wet etching, whereby the etched trace is part of the undercut UC. The undercut UC is an over-etched region of the second layer 422 generated by anisotropic etching during a wet etching. More particularly, in the embodiment of the invention, the undercut UC may be formed at the side surfaces of the second layer 424 of the electrode layer 42a. Since the first layer 422 has superior acid resistance, the undercut UC may be not formed or the undercut UC having a small width may be formed at the first layer 422. Meanwhile, because the second layer 424 has a relatively low acid resistance, the undercut UC may be easily formed at the second layer 424 by the etching solution. Thus, at least a part of the second layer 424 has a width W21 (a width of a narrowest portion of the first electrode 42) smaller than the width W2 of the first electrode 42 (for example, the width of the first layer 422). In FIG. 2, it is exemplified that the width of a portion of the second layer 424 that is adjacent to the first layer 422 is substantially the same as the first layer 422, and the width of the second layer 424 gradually decreases toward the printed electrode layer 424. However, the embodiment of the invention is not limited thereto, and thus, the shape or the width of the second layer 424 by the undercut UC may be varied.

For example, the undercut UC may have a width W22 (or a difference between the width W2 of the first layer 422 and the width W1 of the second layer 424 at one side of the first electrode 42) of about 1 μm to about 10 μm. The undercut UC within the range may be generated by the wet etching. However, the embodiment of the invention is not limited thereto, and thus, the width W2 of the undercut UC may be varied.

It can be seen from the undercut UC that the electrode layer 42a are formed by forming the metal layers for forming the electrode layer 42a over the entire portion of the insulating layer 40 and patterning the metal layers.

The etched trace may be curved in a side view, as shown in FIG. 1, but may also be straight or stepped. Accordingly, the width of the second layer 422 may vary from W2 to W21 along the etched trace. At a portion of the second layer 422 that contacts the printed electrode layer 42b, the undercut UC is the greatest, so that the printed electrode layer 42b has an overhang that is represented by the width W22. The overhang of the printed electrode layer 42b may be planar, curved or irregular.

In the embodiment of the invention, it is exemplified that the electrode layer 42a has the plurality of sub-layers. However, the embodiment of the invention is not limited thereto. Thus, the electrode layer 42a may be formed of a single layer.

The printed electrode layer 42b disposed on (for example, being in contact with) the electrode layer 42a is formed by the printing and has electrical conductivity. Since the printed electrode layer 42b is formed by the printing, the printed electrode 42b constituting the electrode layer 42 is formed on the metal layers to have a predetermined pattern. Thus, the electrode layer 42a can be formed by etching the metal layers constituting the electrode layer 42a through using the printed electrode layer 42b as a mask. Then, a process of forming an additional mask for patterning of the electrode layer 42a and a process of removing of the additional mask can be eliminated. Also, the printed electrode layer 42b is formed of materials having an electrical conductivity, and thus, the printed electrode layer 42b is remained on the electrode layer 42a without removing the printed electrode layer 42b after patterning of the electrode layer 42a. Accordingly, the printed electrode layer 42b may constitute a part of the first electrode 42.

By the printed electrode layer 42b, the first electrode 42 can have a sufficient thickness and the electrical resistance of the first electrode 42 can be largely reduced. Thus, the electrical property of the solar cell 100 can be enhanced. Particularly, the thickness of the printed electrode layer 42b can be easily increased when the printed electrode layer 42b is formed by the printing, compared with when the printed electrode layer 42b is formed by the plating or the sputtering. Thus, the thickness of the printed electrode layer 42b can be larger than the thickness of the electrode layer 42a (or thicknesses of the first layer 422 and the second layer 424 constituting the electrode layer 42a), thereby sufficiently securing the thickness of the first electrode 42.

For example, the printed electrode layer 42b may have a thickness of about 5 μm to about 50 μm. When the first layer 422 is about 5 μm or less, the printed electrode layer 42b may not sufficiently act as a mask for patterning of the electrode layer 42a and the thickness of the first electrode 42 may not sufficient. When the printed electrode layer 42b is about 50 μm or more, the process time and the material cost may increase and the solar cell may be thick. However, the embodiment of the invention is not limited thereto. The thickness of the printed electrode layer 42b may be varied, considering the material, process conditions, and so on of the electrode layer 42a.

The printed electrode layer 42b may include a conductive material having an enhanced connection property with the electrode layer 42a and having an enhanced electrical conductivity and a material for forming a paste (for example, polymers such as the solvent, the resin, and so on). The conductive material may include conductive powders. For example, the conductive material or the conductive powders may include metal (for example, copper, silver, gold, aluminum). When the conductive material may include the copper, the printed electrode layer 42 can have a superior electrical conductivity and the material cost can be reduced. Although the relatively inexpensive conductive material such as copper has the electrical conductivity lower than the expensive conductive material (for example, the silver, the gold, the aluminum), the printed electrode layer 42b can achieve the sufficient electrical conductivity because the printed electrode layer 42b is thicker than the electrode layer 42a.

If the polymers such as the solvent, the resin, and so on are detected when an component analysis of the printed electrode layer 42b is performed, it can be seen that the printed electrode layer 42b is formed by the printing. Selectively, it can be seen that the printed electrode layer 42b is formed by the printing when the conductive material existed in or mixed with the polymer material is discovered in a microphotograph of the printed electrode layer 42b. That is, because the solvent, the resin, and so on are remained in the printed electrode layer 42b, the metal content of the printed electrode layer 42b may be lower than the metal content of the electrode layer 42a. For example, the metal content of the printed electrode layer 42b may be about 95 wt % or less (for example, about 10 wt % to about 90 wt %, and, more particularly, about 10 wt % to about 50 wt %).

However, the printed electrode layer 42b according to the embodiment of the invention does not include an inorganic material such as glass frit, unlike the conventional printed layer used for the electrode. Thus, the printed electrode layer 42b may consist of the conductive material and the polymer material. The conventional printed layer used for the electrode is formed to be in contact with the insulating layer, and penetrates the insulating layer and is connected the conductive type region through fire-through during the firing process. Thus, the conventional printed layer used for the electrode includes the glass frit for the fire-through. On the other hand, in the embodiment of the invention, the printed electrode layer 42b is not in contact with the first conductive type region 32 (the second conductive type region 34 in the instance of the second electrode 44), and is formed on the electrode layer 42a to form the uppermost layer 42 (or the second electrode 44). Thus, the fire-through is not necessary. Accordingly, the printed electrode layer 42b need not include the glass frit. Accordingly, a content of a metal that may deteriorate the electrical property of the printed electrode layer 42b can be reduced.

In addition, the paste used for the printing has a predetermined viscosity and the paste may flow down to edges of the paste. Thus, the printed electrode layer 42b formed by the printing has an upper surface of a gently curved surface (that is, a rounded upper surface or a rounded shape) having a middle portion that is thicker than an edge portion. Thus, it can be seen that the printed electrode layer 42 is formed by the printing with the naked eye.

In the embodiment of the invention, the printed electrode layer 42b is an uppermost layer of the electrode 42, and thus, a ribbon and the like for connecting with the outside (a neighboring solar cell or a junction box) is connected to the printed electrode layer 42b.

Hereafter, planar shapes of the first and second conductive type regions 32 and 34, the barrier region 36, and the first and second electrodes 42 and 44 will be described in detail with reference to FIG. 2.

Referring to FIG. 2, in the embodiment of the invention, the first and second conductive type regions 32 and 34 are extended so as to have a stripe shape and alternately disposed with respect to each other in a direction crossing a longitudinal direction. The barrier region 36 may be disposed to separate the first conductive type region 32 from the second conductive type region 34. Plural first conductive type regions 32 separated from each other may be connected to each other at an edge of a first side thereof, and plural second conductive type regions 34 separated from each other may be connected to each other at an edge of a second side thereof. However, the embodiment of the invention is not limited to the above examples.

In this regard, the first conductive type region 32 may have a wider area than the second conductive type region 34. For example, the areas of the first and second conductive type regions 32 and 34 may be adjusted by differently adjusting widths thereof. That is, a width W3 of the first conductive type region 32 may be greater than a width W4 of the second conductive type region 34. Thereby, the first conductive type region 32 constituting the emitter region has a wide area, and thus, a photoelectric conversion area may be increased. In this regard, when the first conductive type region 32 is p-type conductive, the first conductive type region 32 having a wide area may effectively collect holes having a relatively slow movement rate.

In addition, the first electrode 42 may be formed so as to have a stripe shape to correspond to the first conductive type region 32, and the second electrode 44 may be formed so as to have a stripe shape to correspond to the second conductive type region 34. The first and second openings 402 and 404 may be formed to respectively correspond to total lengths (or areas) of the first and second electrodes 42 and 44. Thus, a contact area between the first electrode 42 and the first conductive type region 32 and a contact area between the second electrode 44 and the second conductive type region 34 are maximized and, accordingly, carrier collection efficiency may be enhanced. However, the embodiment of the invention is not limited to the above examples. In addition, the first and second openings 402 and 404 may also be formed so as to respectively connect only portions of the first and second electrodes 42 and 44 to the first and second conductive type regions 32 and 34. For example, the first and second openings 402 and 404 may be formed as a plurality of contact holes. The first electrodes 42 may be connected to each other at an edge of a first side thereof, and the second electrodes 44 may be connected to each other at an edge of a second side thereof. However, the embodiment of the invention is not limited to the above examples.

Referring back to FIG. 1, an insulating layer (or insulating layers 40) (that is, the passivation layer 24 and/or the anti-reflective layer 26) may be disposed on the front surface of the semiconductor substrate 10 (more particularly, on the front surface field region 130 formed at the front surface of the semiconductor substrate 10). According to embodiments of the invention, only the passivation layer 24 may be formed on the semiconductor substrate 10, only the anti-reflective layer 26 may be formed on the semiconductor substrate 10, or the passivation layer 24 and the anti-reflective layer 26 may be sequentially disposed on the semiconductor substrate 10. FIG. 1 illustrates an instance in which the passivation layer 24 and the anti-reflective layer 26 are sequentially formed on the semiconductor substrate 10 and the semiconductor substrate 10 contacts the passivation layer 24. However, the embodiment of the invention is not limited to the above examples, and the semiconductor substrate 10 may contact the anti-reflective layer 26. In addition, various modifications are possible.

The passivation layer 24 and the anti-reflective layer 26 may be substantially entirely formed on the front surface of the semiconductor substrate 10. In this regard, the expression "entirely formed" as used herein includes an instance in which the passivation layer 24 and the anti-reflective layer 26 are physically completely formed and an instance in which the passivation layer 24 and the anti-reflective layer 26 are incompletely formed by an unavoidable or other reason.

The passivation layer 24 is formed on the front surface of the semiconductor substrate 10 in contact therewith and thus inactivates defects present in the front surface or bulk of the semiconductor substrate 10. Thus, recombination sites of minority carriers are removed and, accordingly, an open circuit voltage of the solar cell 100 may be increased. Also, by the anti-reflection layer 26, the amount of light reaching a pn junction formed at an interface between the base region 110 and the first conductive type region 32 may be increased by reducing the reflectance of light incident upon the front surface of the semiconductor substrate 10. Accordingly, a short-circuit current Isc of the solar cell 100 can be increased. As such, the open circuit voltage and the short-circuit current Isc of the solar cell 100 can be increased by the passivation layer 24 and the anti-reflective layer 26 and, accordingly, the efficiency of the solar cell 100 can be enhanced.

The passivation layer 24 and/or the anti-reflective layer 26 may be formed of various materials. For example, the passivation layer 24 and/or the anti-reflection layer 26 may be any one layer selected from the group consisting of a silicon nitride layer, a hydrogen-containing silicon nitride layer, a silicon oxide layer, a silicon oxynitride layer, an aluminum oxide layer, a $MgF_2$ layer, a ZnS layer, a $TiO_2$ layer, and a $CeO_2$ layer or have a multilayer structure including two or more of the above-listed layers in combination. For example, the passivation layer 24 may include silicon oxide, and the anti-reflective layer 26 may include silicon nitride.

When light is incident upon the solar cell 100 according to the embodiment of the invention, electrons and holes are generated by photoelectric conversion at the pn junction formed between the base region 110 and the first conductive type region 32, and the generated holes and electrons tunnel by tunneling through the tunneling layer 20, respectively move to the first and second conductive type regions 32 and 34 and then respectively migrate to the first and second electrodes 42 and 44. Electric energy is generated thereby.

As in the embodiment of the invention, in the solar cell 100 having a back contact structure in which the first and second electrodes 42 and 44 are formed on the back surface of the semiconductor substrate 10 and not formed on the front surface of the semiconductor substrate 10, shading loss at the front surface of the semiconductor substrate 10 can be minimized. Accordingly, efficiency of the solar cell 100 can be enhanced. However, the embodiment of the invention is not limited to the above examples. For example, the above structures may be applied a solar cell where the first electrode 42 is disposed on the front surface of the semiconductor substrate 10 and the second electrode 44 is disposed on the back surface of the semiconductor substrate 10.

In the embodiment of the invention, the electrode 42 or 44 includes the electrode layer 42a formed by the plating or the sputtering and the printed electrode layer 42b formed on the electrode layer 42a. The patterning of the electrode layer 42a can be performed by using the printed electrode layer 42b. Accordingly, a process of forming an additional mask for forming the electrode layer 42a and a process of removing the additional mask can be omitted. Thus, the manufacturing process of the electrode 42 or 44 can be simplified and the manufacturing process of the solar cell 100 can be largely simplified. In addition, the printed electrode layer 42b used as the mask has the electrical conductivity, and thus, the thickness of the electrode 42 or 44 can be increased and the electrical conductivity of the electrode 42 or 44 can be largely reduced. As a result, the efficiency of solar cell 100 can be largely enhanced.

Hereinafter, the manufacturing method of the solar cell 100 having the above structure will be described in detail with reference to FIGS. 3a to 3j. FIGS. 3a to 3j are sectional views illustrating a method for manufacturing a solar cell according to an embodiment of the invention.

Figure 3A:
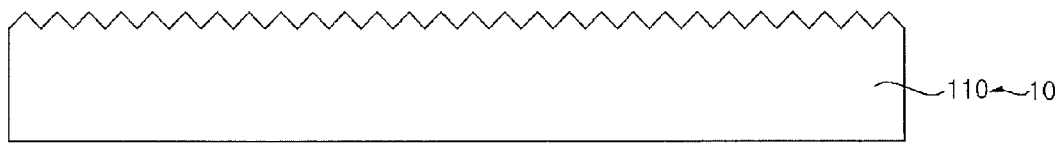
FIGS. 3a to 3j are sectional views illustrating a method for manufacturing a solar cell according to an embodiment of the invention.

First, as shown in FIG. 3a, a semiconductor substrate 10 including a base region 110 having a second conductive type dopant is prepared. In the embodiment of the invention, the semiconductor substrate 10 may be a silicon substrate (for example, a silicon wafer) having an n-type dopant. Examples of the n-type dopant include, but are not limited to, Group V elements such as phosphorous (P), arsenic (As), bismuth (Bi) and antimony (Sb). However, the embodiment of the invention is not limited there to, the base region 110 may have a p-type dopant.

At least one of the front and back surfaces of the semiconductor substrate 10 is textured so that the surface is an uneven surface (or have protruded portions and/or depressed portions). A wet or dry texturing method may be used as the texturing of the surface of the semiconductor substrate 10. A wet texturing may be carried out by dipping the semiconductor substrate 10 in a texturing solution and has an advantage of a short process time. A dry texturing is a process of cutting the surface of the semiconductor substrate 10 using a diamond drill, laser or the like and enables formation of uniform protruded portions and/or depressed portions, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

For example, the front surface of the semiconductor substrate 10 may be textured to have the protruded portions and/or depressed portions or to be uneven surface. Meanwhile, the back surface of the semiconductor substrate 10 may be a relatively smooth and even surface formed by mirror polishing or the like and having a lower surface roughness than the front surface of the semiconductor substrate 10. However, the embodiment of the invention is not limited thereto, and thus, the semiconductor substrate 10 having various structures may be used.

Figure 3B:
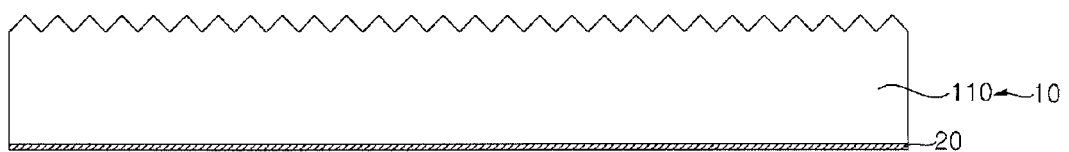

Next, as shown in FIG. 3b, a tunneling layer 20 is formed on the back surface of the semiconductor substrate 10. The tunneling layer 20 may be entirely formed on the back surface of the semiconductor substrate 10.

In this instance, the tunneling layer 20 may be formed, for example, by a method such as thermal growth or deposition (for example, plasma-enhanced chemical vapor deposition chemical (PECVD), atomic layer deposition (ALD)) or the like, but the embodiment of the invention is not limited thereto and the tunneling layer 20 may be formed by a variety of methods.

Figure 3C:
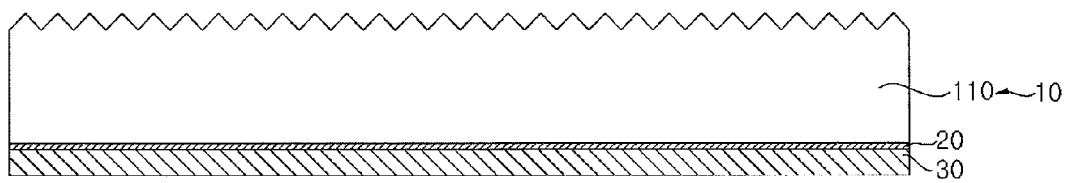
Figure 3D:
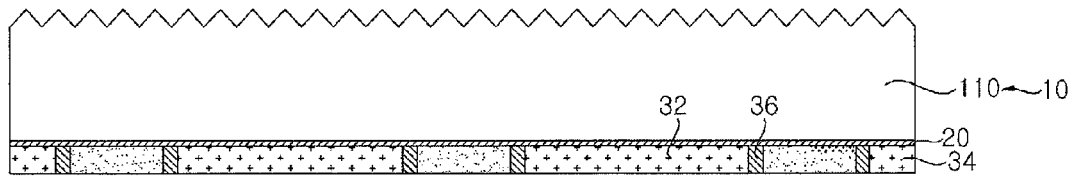

Then, as shown in FIGS. 3c and 3d, the first conductive type region 32 and the second conductive type region 34 are formed on the tunneling layer 20.

As shown in FIG. 3c, a semiconductor layer 30 is formed on the tunneling layer 20. The conductive type regions 32 and 34 may be formed of an amorphous, microcrystalline, or polycrystalline semiconductor. In this instance, the semiconductor layer 30 may be formed by a method, for example, thermal growth, deposition (for example, plasma-enhanced chemical vapor deposition chemical (PECVD)) or the like. However, the embodiment of the invention is not limited thereto, the semiconductor layer 30 may be formed by various methods.

Next, as shown in FIG. 3d, first conductive type regions 32, second conductive type regions 34, and barrier areas 36 are formed at the semiconductor layer 30.

For example, a region of the semiconductor layer 30 is doped with a first conductive type dopant to form the first conductive type region 32 by various methods such as an ion implantation method, a thermal diffusion method, or a laser doping method, and another region thereof is doped with a second conductive type dopant to form the second conductive type region 34 by various methods such as an ion implantation method, a thermal diffusion method, or a laser doping method. Then, the barrier region 36 may be formed in a region of the semiconductor layer 30 between the first and second conductive type regions 32 and 34.

However, the embodiment of the invention is not limited thereto. Various methods may be used for a method for forming the conductive type regions 32 and 34, and barrier region 36. Also, the barrier region 36 may be not formed. That is, various modifications are possible.

Figure 3E:
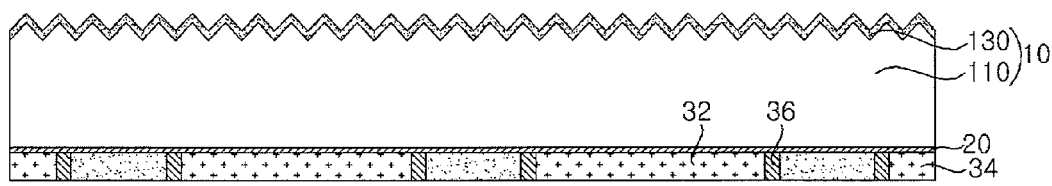

Next, as shown in FIG. 3e, a front surface field region 130 may be formed by doping the second conductive type dopant to the front surface of the semiconductor substrate 10. The front surface field region 130 may be formed by various methods, such as an ion implantation method, a thermal diffusion method, or a laser doping method.

Figure 3F:
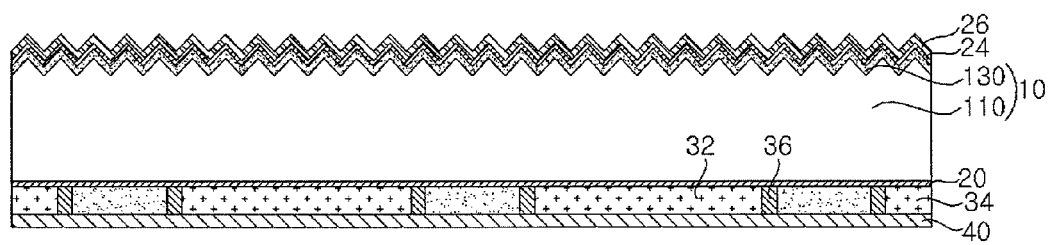

Next, as shown in FIG. 3f, a passivation layer 24 and an anti-reflective layer 26 are sequentially formed on the front surface of the semiconductor substrate 10, and an insulating layer 40 are sequentially formed on the rear surface of the semiconductor substrate 10. That is, the passivation layer 24 and the anti-reflective layer 26 are formed over the entire portion of the front surface of the semiconductor substrate 10, and the insulating layer 40 are formed over the entire portion of the rear surface of the semiconductor substrate 10. The passivation layer 24, the anti-reflective layer 26, and the insulating layer 40 may be formed by a variety of methods such as vacuum deposition, chemical vapor deposition, spin coating, screen printing or spray coating. A formation order of the passivation layer 24 and the anti-reflective layer 26, and the insulating layer 40 may be varied.

Figure 3G:
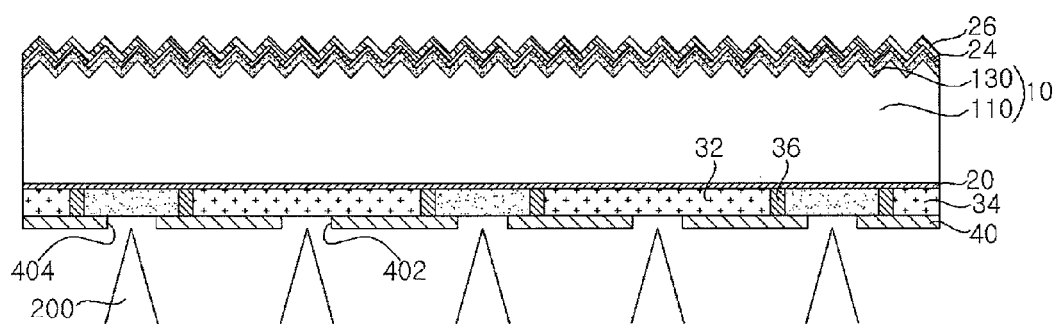
Figure 3H:
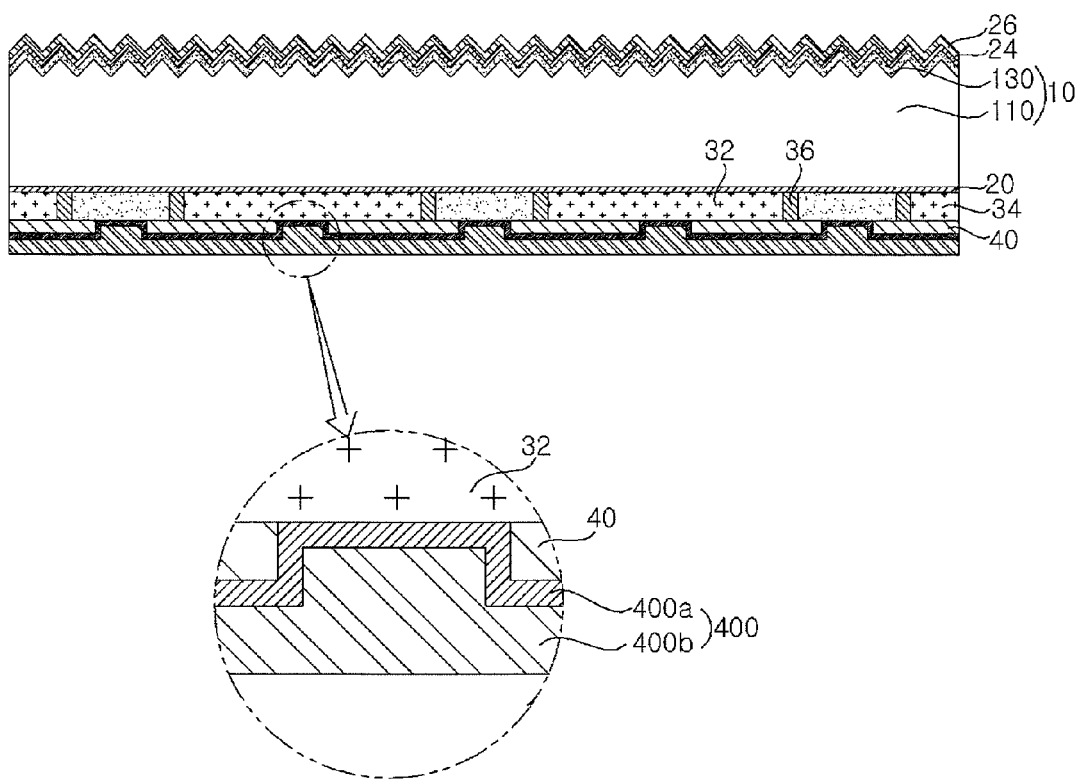

Next, as shown in FIG. 3g, first and second openings 402 and 404 are formed at the insulating layer 40. The first and second openings 402 and 404 may be formed by various methods.

For example, in the embodiment of the invention, the first and second openings 402 and 404 may be formed by a laser ablation (a laser etching) using a laser. By using the laser ablation, widths of the first and second openings 402 and 404 can be reduced, and the first and second openings 402 and 404 having various patters can be easily formed.

Next, as shown in 3h, an metal layer (or metal layers) 400 is formed over the entire portion of the back surface of semiconductor substrate 10 (more particularly, over the entire portion of the semiconductor layer for forming the first and the second conductive type regions 32 and 34) to fill the openings 402 and 404. More particularly, a first metal layer 400a and a second metal layer 400b are sequentially formed by plating or sputtering. However, the embodiment of the invention is not limited thereto, and thus, the first metal layer 400a and the second metal layer 400b may be formed by various methods.

Figure 3I:
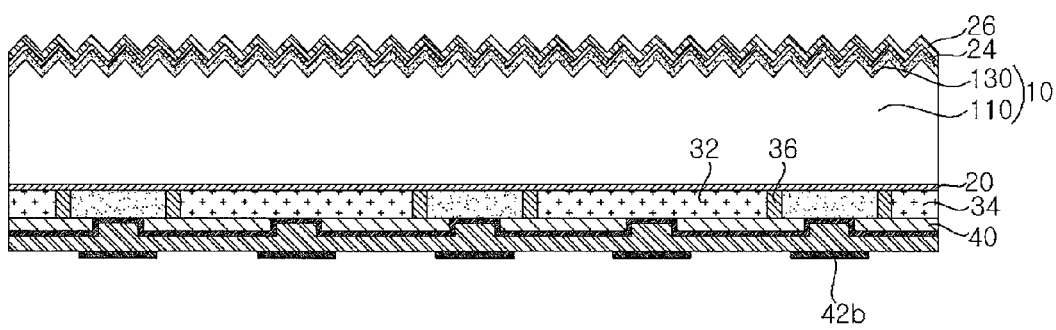

Next, as shown in FIG. 3i, a printed electrode layer 42b is formed on the metal layer 400. The printed electrode layer 42b is formed to correspond to the electrodes 42 and 44. The printed electrode layer 42b prevents a portion of the metal layer 400 corresponding to the electrodes 42 and 44 from being etched during an etching process. The printed electrode layer 42b may have a width larger than a width of the opening 402 or 404.

The printed electrode layer 42b may be formed by coating the paste and firing the printed electrode layer 42b through the heat-treating to be physically and electrically connected to the metal layer 400.

The paste for the printed electrode layer 42b may include a conductive material, a solvent, a resin, and the other various additives. The conductive material is included to provide the electrical conductivity of the printed electrode layer 42b. The solvent is included to mix various materials of the paste and to have a viscosity suitable for the printing. The resin acts as a binder and allows the printed electrode layer 42b to be stable coupled to the metal layer 400. The additives are included to enhance various properties. Known various materials may be used for the conductive material, the solvent, the resin, and the additives, and thus, the detailed descriptions will be omitted. Also, as stated in the above, the printed electrode layer 42b may not include the glass frit.

Because the printed electrode layer 42b is disposed on the metal layer 400 and the opening 402 or 404 is already formed, the fire-through is not needed at the firing of the printed electrode layer 42b. Accordingly, the heat-treating is performed at about 200° C. to about 250° C., which is a very low temperature. Therefore, the high-temperature process for firing of the printed electrode layer 42b can be omitted, thereby simplifying the process manufacturing process and preventing the characteristic breakdown of the semiconductor substrate 10. However, the embodiment of the invention is not limited thereto, and the temperature of the heat-treating may be varied.

Figure 3J:
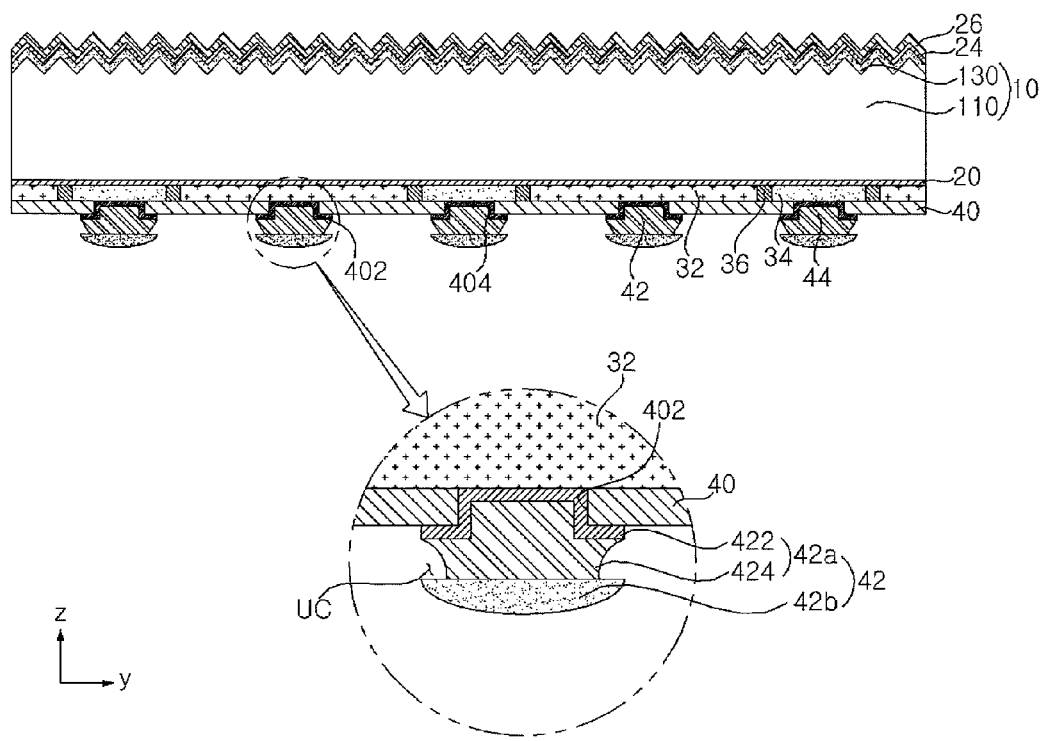

Next, as shown in FIG. 3j, the electrode layer 42a is formed by eliminating the other portion of the metal layer 400 where the printed electrode layer 42b is not formed. Thus, the electrodes 42 and 44 including the electrode layer 42a and the printed electrode layer 42b are formed.

Various methods may be applied to an etching method. For example, a wet etching process using an etching solution may be used. An acid solution may be used for the etching solution, for example, a hydrofluoric acid, a phosphoric acid, a nitric acid, or a combination thereof. A patterning of the electrodes 42 and 44 are performed. By using the wet etching process as in the above, the patterning of the electrodes 42 and 44 can be performed by a simple process. However, the embodiment of the invention is not limited thereto.

In the embodiment of the invention, the electrode layer 42a is formed by entirely forming the metal layer 400 over the insulating layer 40 by the plating or the sputtering, forming the printed electrode layer 42b, and patterning the metal layer 400 by using the printed electrode layer 42b as a mask. Thereby, a process of forming an additional mask for patterning the metal layer 400 and a process of removing the additional mask can be eliminated. Accordingly, the process for forming the solar cell 100 can be simplified.

In the embodiment of the invention, it is exemplified that the tunneling layer 20, the conductive type regions 32 and 34, and the barrier region 36 are formed, and the front surface field layer 130 is formed, and then, the passivation layer 24, the anti-reflective layer 26, and the insulating layer 40 are formed, and finally the first and second electrodes 42 and 44 are formed. However, the embodiment of the invention is not limited thereto. Thus, a formation order of the tunneling layer 20, the second conductive type regions 32 and 34, the barrier region 36, the passivation layer 24, the anti-reflective layer 26, and the insulating layer 40 may be varied. In addition, some of them may be not included, and various modifications are possible.

Hereinafter, solar cells according to other embodiments of the invention and electrodes used for the solar cells will be described in detail. A detailed description of the same or similar elements as those in the foregoing description will be omitted herein and detailed descriptions of only different elements will be provided herein. The combination of the foregoing embodiment and the modified embodiments thereof and the following embodiments and the modified embodiments thereof fall within the spirit and scope of the embodiment of the invention.

Figure 4:
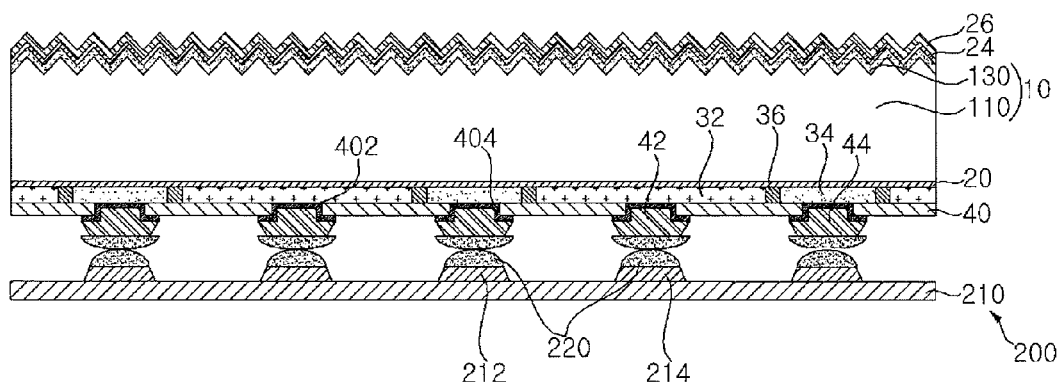
FIG. 4 is a sectional view of a solar cell according to another embodiment of the invention.

FIG. 4 is a sectional view of an electrode of a solar cell according to another embodiment of the invention.

Referring to FIG. 4, in the embodiment of the invention, a circuit sheet 200 may be attached to the solar cell 100. The circuit sheet 200 includes circuit patterns 212 and 214 and a base member 210 to connect a plurality of solar cells 100. In the embodiment of the invention, the circuit sheet 200 of an integral structure or a single body includes the circuit patterns 212 and 214 corresponding to the plurality of solar cells 100 (for example, three or more solar cells 100), unlike a ribbon corresponding to only two solar cells 100 to connect two adjacent solar cells 100. Thus, the plurality of solar cells 100 (for example, three or more solar cells 100) can be electrically connected to each other by attaching the circuit sheet 200 on the solar cells 100.

The base member 210 of the circuit sheet 200 may be a film, a sheet, a substrate, or the like, which is formed of a material that has light transmittance and insulation properties and is capable of maintaining the mechanical strength of the circuit sheet 200. The base member 210 of the circuit sheet 200 may be formed of at least one of polyethylene, polypropylene, polyethylene terephthalate, polyethylene-2, 6-naphthalate, polypropylene terephthalate, polyimide, polyamideimide, polyethersulfone, polyetheretherketone, polycarbonate, polyarylate, cellulose propionate, polyvinylchloride, polyvinylidene chloride, polyvinyl alcohol, polyetherimide, polyphenylensulfide, polyphenyleneoxide, polystyrene, and the like. However, the embodiment of the invention is not limited thereto, and the base member 210 may be formed of various other materials that are different from the aforementioned materials.

The circuit patterns 212 and 214 may be positioned at a surface of the base member 210 facing the electrodes 42 and 44. The circuit patterns 212 and 214 may have various planar shapes for electrically connecting the plurality of the solar cells 100. The circuit patterns 212 and 214 may include a first circuit pattern 212 being electrically connected to the first electrode 42 and a second circuit pattern 214 being electrically connected to the second electrode 44. The first circuit pattern 212 of one solar cell 100 is connected to a second circuit pattern 214 of another solar cell 100 adjacent to the one solar cell 100 at one side, and the second circuit pattern 214 of the one solar cell 100 is connected to a first circuit pattern 212 of yet another solar cell 100 adjacent to the one solar cell 100 at the other side. Then, a plurality of solar cells 100 can be connected in series. However, the embodiment of the invention is not limited thereto. The shapes and connection structures of the circuit patterns 212 and 214, and connection structures of the plurality of the solar cells 100 may be variously varied.

The circuit patterns 212 and 214 of the circuit sheet 200 and the electrodes 42 and 44 are bonded and fixed while interposing the conductive adhesive layer 220, respectively. The conductive adhesive layer 220 may be formed of a conductive paste, a conductive film, and so on. That is, the materials and the shapes of the conductive adhesive layer 220 may be varied. However, the embodiment of the invention is not limited thereto. The circuit patterns 212 and 214 and the electrodes 42 and 44 may be in direct contact with each other without the conductive adhesive layer 220. The other modification may be possible.

When the plurality of solar cells 100 are connected by the circuit sheet 200 as in the above, the manufacturing process can be simplified, compared with the instance that the plurality of solar cells 100 are connected by the ribbon. In addition, the circuit patterns 212 and 214 of the circuit sheet 200 can collect the carriers and transform them to the outside, along with the electrodes 42 and 44, thereby enhancing the collecting efficiency of the carriers.

Figure 5:
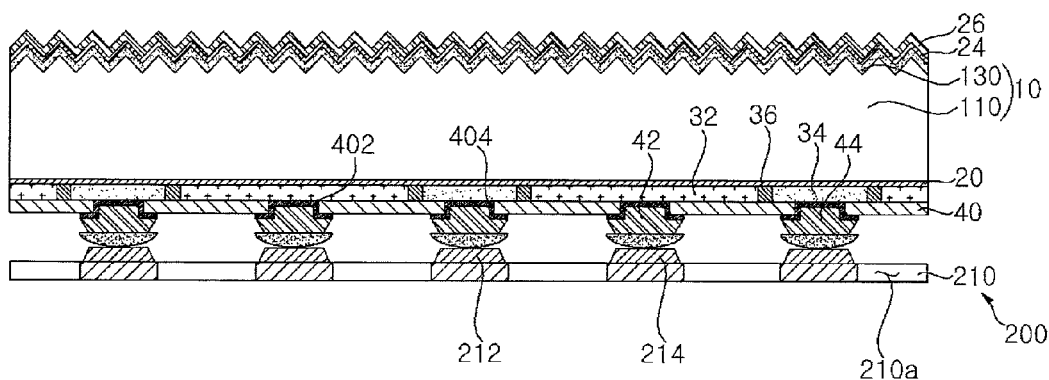
FIG. 5 is a sectional view of a solar cell according to still another embodiment of the invention.

FIG. 5 is a sectional view of an electrode of a solar cell according to yet another embodiment of the invention.

Referring to FIG. 5, in the embodiment of the invention, a circuit sheet 200 including circuit patterns 212 and 214 and a base member 210 and connecting a plurality of solar cells 100 may be attached on the solar cell 100. The descriptions of the circuit sheet 200 according to the embodiment of the invention that at the same as or similar to the descriptions of the circuit sheet 200 shown in FIG. 4 will be omitted.

In the embodiment of the invention, an opening or openings 210a are formed at a portion or portions of the base member 210 where the circuit patterns 212 and 214 are not formed, unlike in the embodiment of the invention shown in FIG. 4. An etching solution may pass through the opening 210a when a metal layer (reference numeral 400 of FIG. 6a) is etched. In FIG. 5, it is exemplified that one big opening 210a is formed between adjacent circuit patterns 212 and 214. According to this, the etching solution can easily reach the metal layer 400 through one big opening 210a, and thus, the etching process can be easily performed. However, the embodiment of the invention is not limited thereto. Therefore, a plurality of opening 210a having relatively small areas may be densely positioned between the adjacent circuit patterns 212 and 214. In this instance, the etching process can be performed through the plurality of openings 210a, and mechanical strength of the base member 210 can be increased.

Also, in the embodiment of the invention, an additional conductive adhesive layer (reference numeral 220 of FIG. 4) is not included between the electrodes 42 and 44 and the circuit patterns 212 and 214. That is, the electrodes 42 and 44 may be in direct contact with the circuit patterns 212 and 214. This is because the printed electrode layer 42b is firstly formed by a printing, and then, the printed electrode layer 42b is connected to the circuit patterns 212 and 214 are connected by using the printed electrode layer 42b as an adhesive layer before the firing. Thus, the additional conductive adhesive layer 220 can be omitted, and thus, cost for material can be reduced and the manufacturing process can be simplified.

A method for manufacturing the solar cell 100 will be described in detail with reference to FIG. 6a to FIG. 6d. FIGS. 6a to 6d are sectional views illustrating a method for manufacturing a solar cell according to an embodiment of the invention.

Figure 6A:
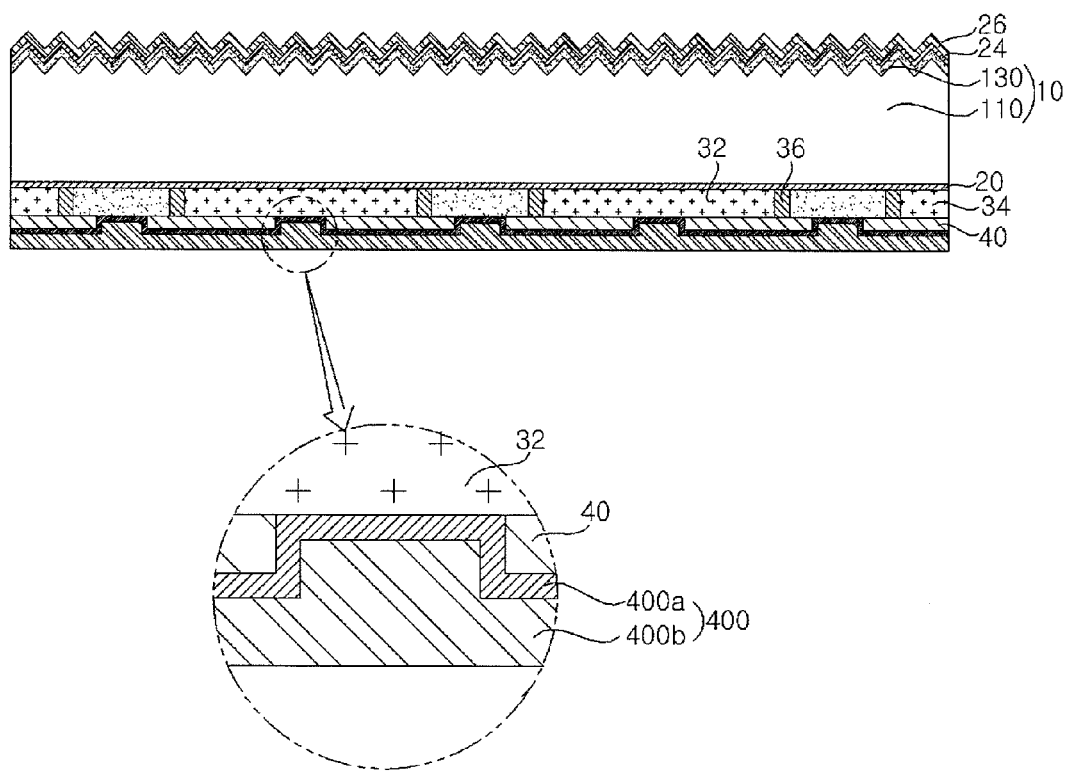
FIGS. 6a to 6d are sectional views illustrating a method for manufacturing a solar cell illustrated in FIG. 5.

As shown in FIG. 6a, a tunneling layer 20, conductive type regions 32 and 34, an insulating layer 40, a metal layer 400 are formed on a back surface of the semiconductor substrate 100, and a front surface field region 130, a passivation layer 24, and an anti-reflective layer 26 are formed on a front surface of the semiconductor substrate 100. The descriptions related to FIGS. 3a and 3i are the same as or similar to the above, and thus, the descriptions related to FIGS. 3a and 3i may be applied to this embodiment.

Figure 6B:
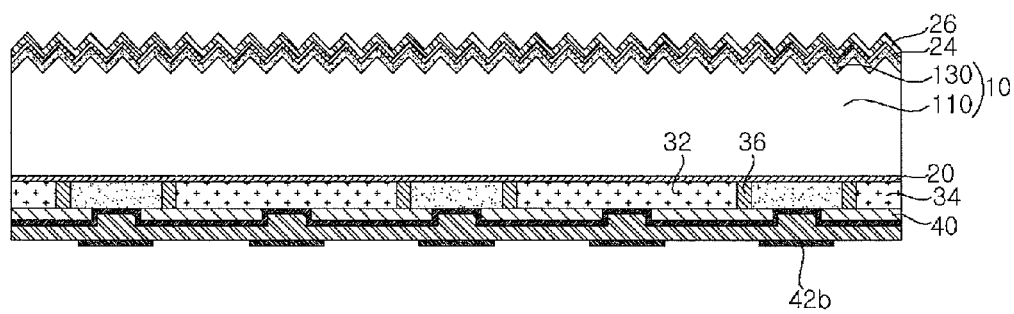

As shown in FIG. 6b, a paste for forming a printed electrode layer 42b is coated or formed on the metal layer 400. The printed electrode 42b is formed in a state of having a predetermined pattern corresponding to an electrode 42 or 44. The printed electrode layer 42b has a width wider than a width of the opening 402 or 404. The material and so on of the paste for forming the printed electrode layer 42b is the same as or similar to the same in the descriptions related to FIG. 3i, and thus, the descriptions thereof will be omitted.

Figure 6C:
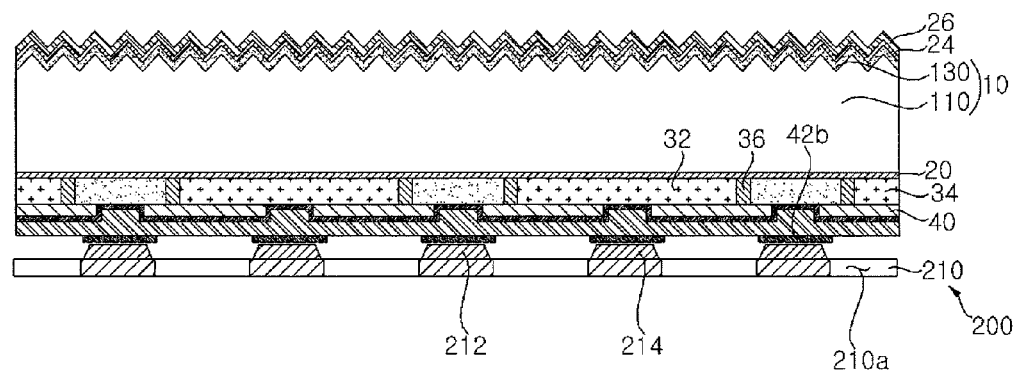

As shown in FIG. 6c, the printed electrode layer 42b is fired by a heat-treating in a state that the circuit patterns 212 and 214 are positioned on the printed electrode layer 42b. That is, a step for positioning the circuit patterns 212 and 214 on the paste is included between a step of coating the paste and a step for firing the paste of the printed electrode layer 42b by the heat-treating. The printed electrode layer 42b and the circuit patterns 212 and 214 are physically connected when the paste of the printed electrode layer 42b is fired.

That is, the paste is fired in the state that the printed electrode layer 42b and the circuit patterns 212 and 214 are physically connected. The printed electrode layer 42b and the circuit patterns 212 and 214 are physically and electrically connected by the printed electrode layer 42b. Thus, the printed electrode layer 42b and the circuit patterns 212 and 21 are physically and electrically connected without the additional conductive adhesive layer 220. As a result, the cost for the material can be reduced and the process time can be decreased.

Figure 6D:
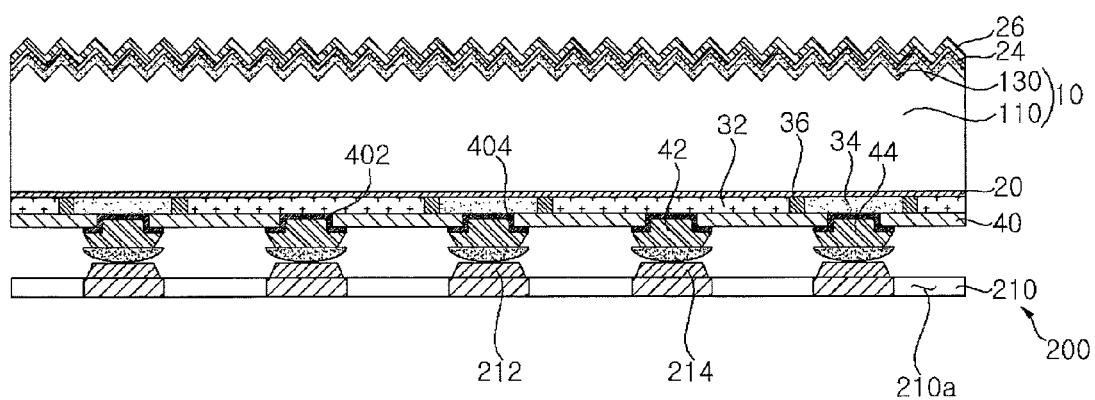

Next, as shown in FIG. 6d, a portion of the metal layer 400 exposed through the opening 210a of the base member 210 is removed by an etching solution, an etching apparatus, or so on, and thereby forming the electrode layer 42a. Thus, the electrodes 42 and 44 including the electrode layer 42a and the printed electrode layer 42b are formed. The etching method and so on is the same as or similar to the same in the descriptions related to FIG. 3j, and thus, the descriptions thereof will be omitted.

Particular characteristics, structures, or effects described in connection with the embodiment of the invention are included in at least one embodiment of the embodiments of the invention and not necessarily in all embodiments of the invention. Furthermore, the particular characteristics, structures, or effects of any specific embodiment of the embodiments of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiments of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments. In addition, it is to be understood that differences relevant to the variations and modifications fall within the spirit and scope of the embodiments of the invention defined in the appended claims.

What is claimed is:

1. A solar cell, comprising:
a semiconductor substrate;
a conductive region on one surface of the semiconductor substrate; and
an electrode connected to the conductive region,
wherein the electrode comprises:
an electrode layer on the conductive region; and
a printed electrode layer on the electrode layer,
wherein the electrode layer includes at least one metal,
wherein the printed electrode layer comprises a conductive material and a polymer material,
wherein the electrode layer comprises:
 a first layer formed on the conductive type region and comprising a first metal, and
 a second layer formed on the first layer and comprising a second metal,
wherein the first layer has a coefficient of thermal expansion between a coefficient of thermal expansion of the semiconductor substrate and a coefficient of thermal expansion of a portion of the second layer adjacent to the first layer, and
wherein the second layer has a thickness larger than the first layer.

2. The solar cell according to claim 1, wherein the electrode layer has an etched trace at at least a part of side surfaces of the electrode layer.

3. The solar cell according to claim 1, wherein the electrode layer includes a plated layer or a sputtered layer.

4. The solar cell according to claim 1, wherein an amount of a metal of the printed electrode layer is smaller than an amount of the at least one metal of the electrode layer, and the printed electrode layer has a rounded shape.

5. The solar cell according to claim 1, further comprising:
an insulating layer on the conductive region, wherein the insulating layer has an opening corresponding to the electrode,
wherein the electrode layer is in contact with a surface at the bottom of the opening, side surfaces of the insulating layer adjacent to the opening, and an upper surface of the insulating layer adjacent to the opening.

6. The solar cell according to claim 1, wherein the printed electrode layer is an uppermost layer of the electrode.

7. The solar cell according to claim 1, further comprising:
a ribbon or a circuit sheet on the printed electrode layer.

8. The solar cell according to claim 7, wherein the circuit sheet comprises:
a base member, and
a circuit pattern on the base member, the circuit pattern connected to the printed electrode layer,
wherein the circuit pattern is in direct contact with the printed electrode layer or the circuit pattern is connected to the printed electrode layer while interposing a conductive adhesive layer.

9. The solar cell according to claim 8, wherein the circuit pattern is in direct contact with the printed electrode layer, and
the base member has an opening at a portion of the base member where the circuit pattern is not formed.

10. The solar cell according to claim 8, further comprising:
a tunneling layer between the semiconductor substrate and the conductive region,
wherein the conductive region comprises a first conductive region and a second conductive region on the same surface of the tunneling layer, and
the first conductive region and the second conductive region have different conductivity types from each other.

* * * * *